United States Patent
Sobue

(10) Patent No.: US 11,101,292 B2
(45) Date of Patent: Aug. 24, 2021

(54) SEMICONDUCTOR INTEGRATED CIRCUIT DEVICE

(71) Applicant: SOCIONEXT INC., Kanagawa (JP)

(72) Inventor: Isaya Sobue, Kanagawa (JP)

(73) Assignee: SOCIONEXT INC., Kanagawa (JP)

(*) Notice: Subject to any disclaimer, the term of this patent is extended or adjusted under 35 U.S.C. 154(b) by 105 days.

(21) Appl. No.: 16/684,322

(22) Filed: Nov. 14, 2019

(65) Prior Publication Data

US 2020/0083252 A1    Mar. 12, 2020

Related U.S. Application Data

(63) Continuation of application No. PCT/JP2018/016824, filed on Apr. 25, 2018.

(30) Foreign Application Priority Data

May 15, 2017 (JP) .............................. JP2017-096404

(51) Int. Cl.
  *H01L 27/118*   (2006.01)
  *H01L 27/02*    (2006.01)

(52) U.S. Cl.
  CPC .... *H01L 27/11898* (2013.01); *H01L 27/0207* (2013.01)

(58) Field of Classification Search
  CPC ...................... H01L 27/11898; H01L 27/0207
  See application file for complete search history.

(56) References Cited

U.S. PATENT DOCUMENTS

| 5,885,855 | A | * | 3/1999 | Liang | ....................... H01L 23/50 438/128 |
| 6,075,260 | A | * | 6/2000 | Harayama | ............. H01L 27/118 257/206 |
| 2003/0057549 | A1 | | 3/2003 | Sei | |
| 2005/0127405 | A1 | | 6/2005 | Chen et al. | |

FOREIGN PATENT DOCUMENTS

| JP | S60-110137 A | 6/1985 |
| JP | 2003-100891 A | 4/2003 |
| JP | 2004-179184 A | 6/2004 |
| JP | 2009-032908 A | 2/2009 |
| JP | 2013-038366 A | 2/2013 |
| JP | 2013-131619 A | 7/2013 |

OTHER PUBLICATIONS

International Search Report issued in corresponding International Patent Application No. PCT/JP2018/016824, dated May 29, 2018, with partial translation.

* cited by examiner

*Primary Examiner* — Marc Anthony Armand

(74) *Attorney, Agent, or Firm* — McDermott Will and Emery LLP

(57) ABSTRACT

A semiconductor integrated circuit device including a plurality of rows of IO cells has a configuration capable of avoiding a latchup error without causing an increase in area. The device includes a first IO cell row placed closest to an edge of a chip and a second IO cell row placed adjacent to a core region side of the first IO cell row. Each of the IO cells of the first and second IO cell rows has a high power supply voltage region and a low power supply voltage region provided separately in a direction perpendicular to a direction in which the IO cells are lined up. The IO cell rows are placed so that the high power supply voltage regions of these rows are mutually opposed.

19 Claims, 11 Drawing Sheets

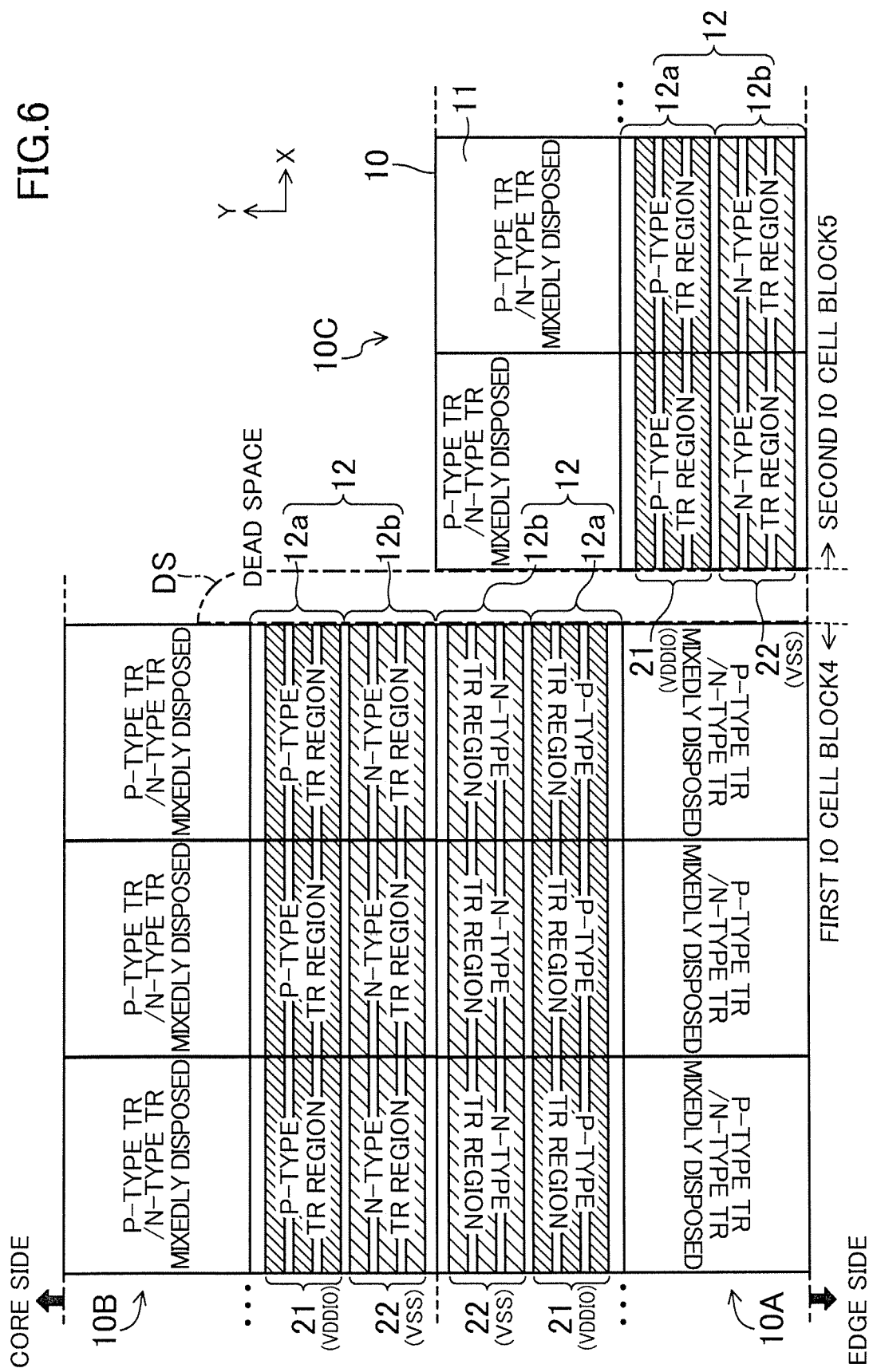

SEMICONDUCTOR INTEGRATED CIRCUIT DEVICE

CROSS-REFERENCE TO RELATED APPLICATIONS

This is a continuation of International Application No. PCT/JP2018/016824 filed on Apr. 25, 2018, which claims priority to Japanese Patent Application No. 2017-096404 filed on May 15, 2017. The entire disclosures of these applications are incorporated by reference herein.

BACKGROUND

The present disclosure relates to a semiconductor integrated circuit device in which a core region and an IO region are placed on a chip.

Recent semiconductor integrated circuits are becoming larger in scale, thereby increasing the number of input/output signals. For this reason, when input/output cells (IO cells) are arranged in a single row around a core region, the area of the semiconductor integrated circuit is determined by the IO cells, causing in some cases a problem of increasing the area of a device in which the semiconductor integrated circuit is configured, i.e., a semiconductor integrated circuit device.

Japanese Unexamined Patent Publication No. 2003-100891 (Patent Document 1) discloses a configuration of a semiconductor integrated circuit device in which IO cells are arranged in a double row. Also, U.S. Patent Application Publication No. 2005/0127405 (Patent Document 2) discloses configurations of semiconductor devices in which IO cells are arranged in one row, in two rows, and in three rows.

SUMMARY

An IO cell generally has: a high power supply voltage region including an ESD circuit and an output buffer for outputting a signal to the outside of the semiconductor integrated circuit device; and a lower power supply voltage region including a circuit portion for inputting/outputting a signal into/from the inside of the semiconductor integrated circuit device. The low power supply voltage region uses the same power supply voltage as an internal circuit formed in the core region of the chip.

With the recent progress in implementing finer devices, the power supply voltage inside the chip is decreasing. However, the power supply voltage outside the chip has not decreased so much as the power supply voltage inside the chip has: in particular, in some cases, voltage reduction has not proceeded because of various interface standards, etc. For this reason, in the IO cell, the difference in power supply potential between the high power supply voltage region and the low power supply voltage region has become great.

Therefore, the difference in the voltage applied to transistors and wells is great between the high power supply voltage region and the low power supply voltage region, whereby a breakdown due to a so-called latchup error tends to occur. To prevent a latchup error, it is necessary to secure sufficiently large inter-transistor and inter-well distances between the high power supply voltage region and the low power supply voltage region. In particular, in the high power supply voltage region, this measure is necessary for the output buffer and the ESD circuit that are directly connected to terminals outside the chip and thus tend to receive noise from outside the chip.

In the configuration of FIG. 1 of Patent Document 1, however, the external signal terminals 14b in the high power supply voltage parts of the IO cells in the second row face the core region. To prevent a latchup error, therefore, it is necessary to secure large space between the IO cells and the core region. Also, in the configuration of FIG. 2 of Patent Document 2, the low power supply voltage parts of the IO cells 27 in the first row and the high power supply voltage parts of the IO cells 28 in the second row face each other. To prevent a latchup error, therefore, it is necessary to secure large space between the IO cells 27 and 28.

Thus, in the configurations of Patent Documents 1 and 2, to address the problem of a latchup error, the area of the semiconductor integrated circuit device must be increased, which is undesirable.

An objective of the present disclosure is providing a semiconductor integrated circuit device provided with a plurality of rows of IO cells, having a configuration capable of avoiding a latchup error without causing an increase in area.

According to one form of the present disclosure, a semiconductor integrated circuit device includes: a chip; a core region provided on the chip; and an IO region provided between the core region and a periphery of the chip on the chip, wherein in the IO region, two or more IO cell rows, each having a plurality of IO cells lined up in a first direction that is a direction along the periphery of the chip, are placed side by side in a second direction perpendicular to the first direction, the two or more IO cell rows include a first IO cell row placed closest to an edge of the chip out of the two or more IO cell rows, and a second IO cell row placed to be adjacent to the first IO cell row on the side of the first IO cell row closer to the core region, each of the IO cells of the first and second IO cell rows has a high power supply voltage region and a low power supply voltage region provided separately in the second direction, and the first and second IO cell rows are placed so that the high power supply voltage regions of these rows are mutually opposed.

According to the above form, the semiconductor integrated circuit device includes the first IO cell row placed closest to the edge of the chip and the second IO cell row placed adjacent to the first IO cell row on the core region side of the first IO cell row. Each of the IO cells of the first and second IO cell rows includes the high power supply voltage region and the low power supply voltage region provided separately in the second direction perpendicular to the direction in which the IO cells are lined up. The first and second IO cell rows are placed so that the high power supply voltage regions of these rows are mutually opposed. That is, since it is the high power supply voltage regions that are mutually opposed in the first IO cell row and the second IO cell row, it is unnecessary to secure space for avoiding a latchup error between the first IO cell row and the second IO cell row. Also, since the low power supply voltage regions are located closer to the core region in the second IO cell row, it is unnecessary to secure space for avoiding a latchup error on the core region side of the second IO cell row. Accordingly, a latchup error can be avoided without causing an increase in the area of the semiconductor integrated circuit device.

According to another mode of the present disclosure, a semiconductor integrated circuit device includes: a chip; a core region provided on the chip; and an IO region provided between the core region and a periphery of the chip on the chip, including first and second IO cell blocks adjacent in a first direction that is a direction along the periphery of the chip, wherein in the first IO cell block, two or more IO cell rows, each having a plurality of IO cells lined up in the first direction, are placed side by side in a second direction perpendicular to the first direction, the two or more IO cell rows include a first IO cell row placed closest to an edge of the chip out of the two or more IO cell rows, and a second IO cell row placed to be adjacent to the first IO cell row on the side of the first IO cell row closer to the core region, in the second IO cell block, a third IO cell row having a plurality of IO cells lined up in the first direction is placed as a single row, each of the IO cells of the first, second, and third IO cell rows has a high power supply voltage region and a low power supply voltage region provided separately in the second direction, the first and second IO cell rows are placed so that the high power supply voltage regions of these rows are mutually opposed, and the third IO cell row is placed so that the high power supply voltage regions are located closer to the edge of the chip.

According to the above mode, the semiconductor integrated circuit device includes the first and second IO cell blocks adjacent to each other in the first direction in which the IO cells are lined up. The first IO cell block includes the first IO cell row placed closest to the edge of the chip and the second IO cell row placed adjacent to the first IO cell row on the core region side of the first IO cell row. The second IO cell block includes the third IO cell row as a single row. Each of the IO cells of the first to third IO cell rows has the high power supply voltage region and the low power supply voltage region provided separately in the second direction perpendicular to the direction in which the IO cells are lined up. The first and second IO cell rows are placed so that the high power supply voltage regions of these rows are mutually opposed. That is, since it is the high power supply voltage regions that are mutually opposed in the first IO cell row and the second IO cell row, it is unnecessary to secure space for avoiding a latchup error between the first IO cell row and the second IO cell row. Also, since the low power supply voltage regions are located closer to the core region in the second IO cell row, it is unnecessary to secure space for avoiding a latchup error on the core region side of the second IO cell row. The third IO cell row is placed so that the high power supply voltage regions are located closer to the edge of the chip. That is, since the low power supply voltage regions are located closer to the core region in the third IO cell row, it is unnecessary to secure space for avoiding a latchup error on the core region side of the third IO cell row. Accordingly, a latchup error can be avoided without causing an increase in the area of the semiconductor integrated circuit device.

According to the semiconductor integrated circuit device of the present disclosure, a latchup error can be avoided without causing an increase in the area of the semiconductor integrated circuit device.

BRIEF DESCRIPTION OF THE DRAWINGS

FIG. 6 shows a placement example of IO cells in a semiconductor integrated circuit device according to the second embodiment.

DETAILED DESCRIPTION

Embodiments of the present disclosure will be described hereinafter with reference to the accompanying drawings.

Figure 1:
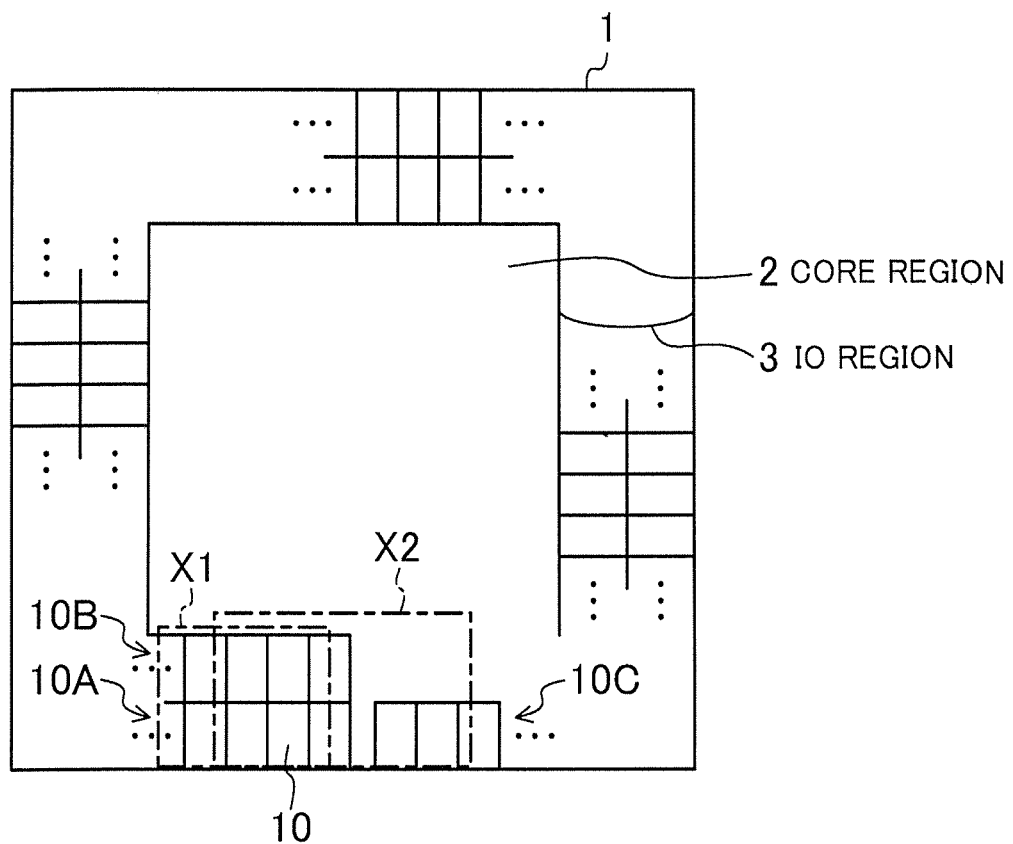
FIG. 1 is a plan view diagrammatically showing the entire configuration of a semiconductor integrated circuit device according to an embodiment.

FIG. 1 is a plan view diagrammatically showing the entire configuration of a semiconductor integrated circuit device according to an embodiment. The semiconductor integrated circuit device shown in FIG. 1 has a core region 2 in which internal core circuits are formed and an IO region 3 in which interface circuits (IO circuits) are formed, both provided on a chip 1. The IO region 3 is provided around the core region 2. In the IO region 3, two IO cell rows 10A and 10B are placed along the periphery of the chip 1. In part of the IO region 3, however, only one IO cell row 10C is placed. Note that IO cells may be placed in two rows in the entire IO region 3. Otherwise, two or more rows of IO cells may be placed. Although illustration is simplified in FIG. 1, a plurality of IO cells 10 constituting the interface circuits are lined up in each of the IO cell rows 10A, 10B, and 10C. Also, although illustration is omitted in FIG. 1, a plurality of external connection pads are placed in the semiconductor integrated circuit device 1.

Figure 2:
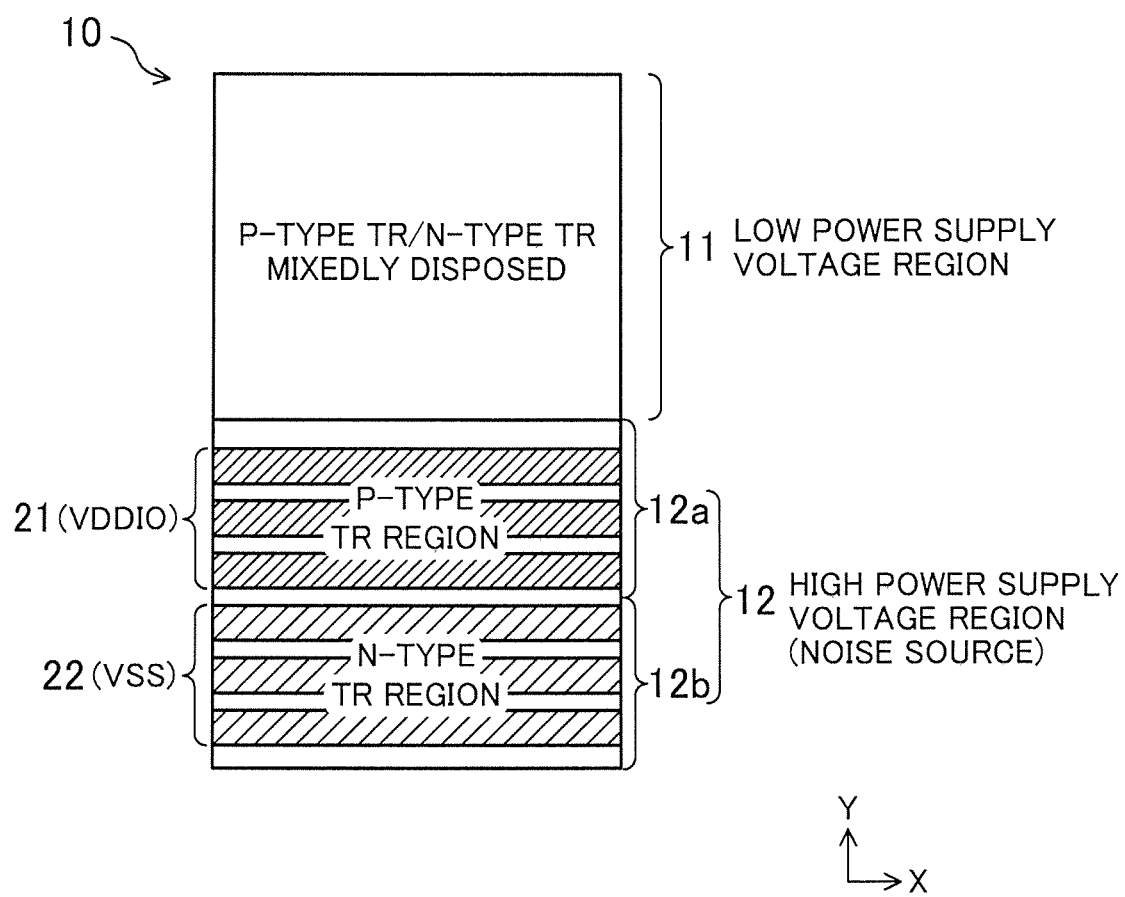
FIG. 2 shows a configuration example of an IO cell.

FIG. 2 shows a configuration example of the IO cell 10. Note that in FIG. 2 illustration is omitted for the internal configuration of the IO cell and signal interconnects. This also applies to the drawings to follow. An IO cell generally has a high power supply voltage region including an ESD circuit and an output buffer for outputting a signal to the outside of the semiconductor integrated circuit device and a low power supply voltage region including a circuit portion for inputting/outputting a signal into/from the inside of the semiconductor integrated circuit device. The IO cell 10 of FIG. 2 has a low power supply voltage region 11 and a high power supply voltage region 12 separated in the Y direction (vertical direction as viewed from the figure). Note that, as used herein, the X direction refers to the direction along the periphery of the chip 1, corresponding to the first direction along which the IO cells 10 are lined up, and the Y direction refers to the direction from the edge of the chip 1 toward the core region 2, corresponding to the second direction perpendicular to the X direction as viewed from top.

In the low power supply voltage region 11, p-type transistors and n-type transistors are disposed in a mixed manner, in which p-type transistors are formed in p-type transistor regions and n-type transistors are formed in n-type transistor regions. In the high power supply voltage region 12, a p-type transistor region 12a in which p-type transistors are formed and an n-type transistor region 12b in which n-type transistors are formed are located separately in the Y direction. In the p-type transistor region 12a, power supply interconnects 21 that extend in the X direction to supply an IO power supply potential VDDIO to the IO cell 10 are provided. In the n-type transistor region 12b, power supply interconnects 22 that extend in the X direction to supply a ground potential VSS to the IO cell 10 are provided. Although illustration is omitted, power supply interconnects are also provided in the low power supply voltage region 11. Devices other than the transistors, such as diodes, may be formed in the low power supply voltage region 11 and the high power supply voltage region 12 of the IO cell 10.

First Embodiment

Figure 3:
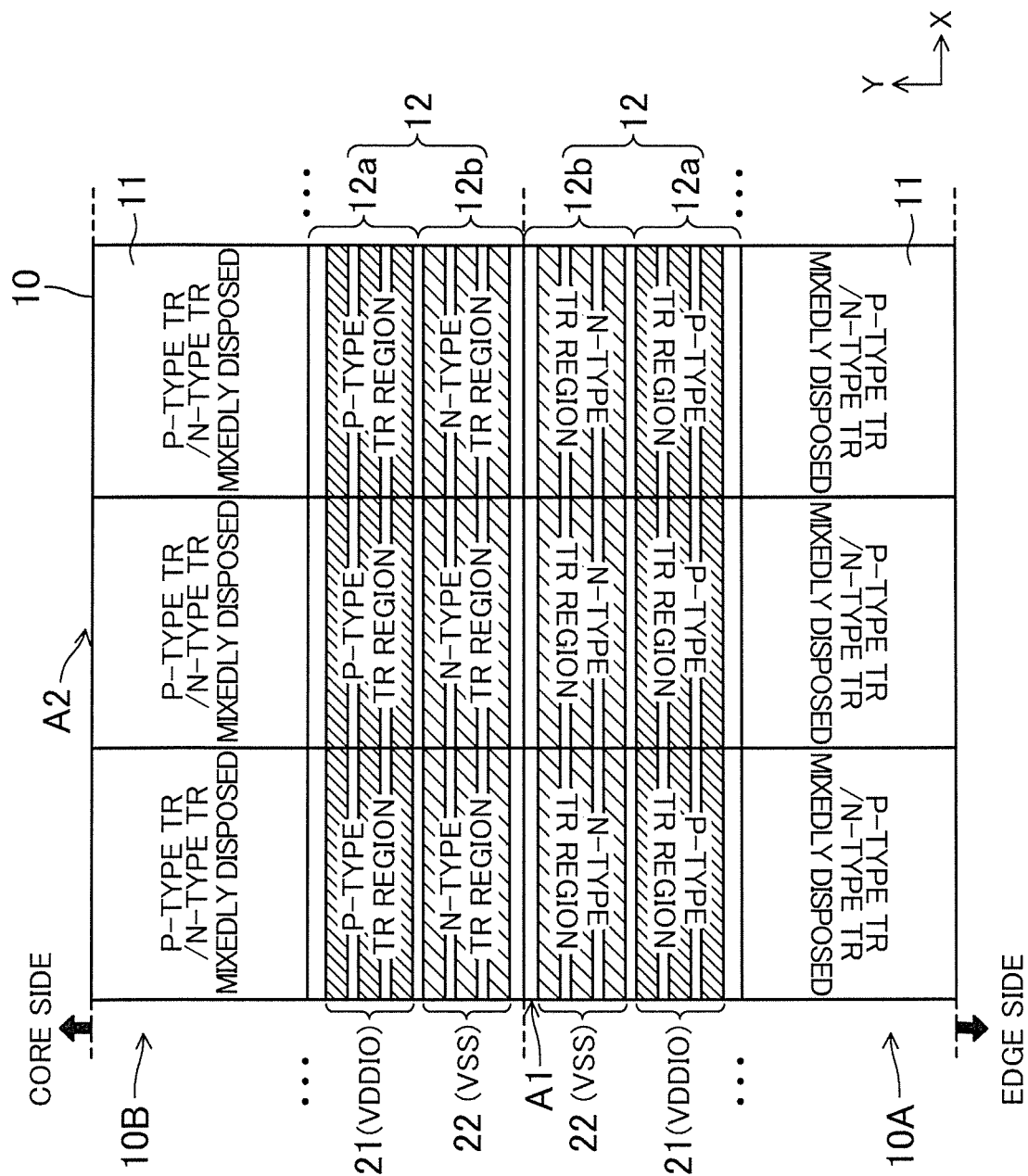
FIG. 3 shows a placement example of IO cells in a semiconductor integrated circuit device according to the first embodiment.

FIG. 3 is a view showing a placement example of IO cells in a semiconductor integrated circuit device according to the first embodiment, which corresponds to an enlarged view of part X1 in FIG. 1. In FIG. 3, the two IO cell rows 10A and 10B, each including a plurality of IO cells 10 lined up in the X direction (the horizontal direction as viewed from the figure; the direction along the periphery of the chip 1), are placed side by side in the Y direction (the vertical direction as viewed from the figure; the direction from the edge of the chip 1 toward the core region 2). The IO cell row 10A, which corresponds to the first IO cell row, is located closest to the edge of the chip 1 out of two or more IO cell rows (the IO cell rows 10A and 10B in the illustrated example) placed side by side in the Y direction. The IO cell row 10B, which corresponds to the second IO cell row, is placed adjacent to the IO cell row 10A on the core region 2 side of the IO cell row 10A.

In the placement example of FIG. 3, the IO cells 10 of the IO cell row 10A are placed so that the high power supply voltage regions 12 are located closer to the core region 2, and the IO cells 10 of the IO cell row 10B are placed so that the low power supply voltage regions 11 are located closer to the core region 2. That is, the two IO cell rows 10A and 10B are placed so that the high power supply voltage regions 12 of these rows are mutually opposed. In the placement example of FIG. 3, it is assumed that the IO cells 10 of the IO cell row 10A are the same in size and position in the Y direction, and the IO cells 10 of the IO cell row 10B are the same in size and position in the Y direction. It is also assumed that, in the IO cell rows 10A and 10B, the opposed IO cells 10 are the same in size and position in the X direction.

In the placement example of FIG. 3, since the n-type transistor regions 12b of the high power supply voltage regions 12 of the IO cell rows 10A and 10B are mutually opposed, it is unnecessary to secure space for avoiding a latchup error between the IO cell row 10A and the IO cell row 10B (indicated by arrow A1 in FIG. 3). Also, since the low power supply voltage regions 11 are located closer to the core region 2 in the IO cell row 10B, it is unnecessary to secure space for avoiding a latchup error between the IO cell row 10B and the core region 2 (indicated by arrow A2 in FIG. 3).

Figure 4:
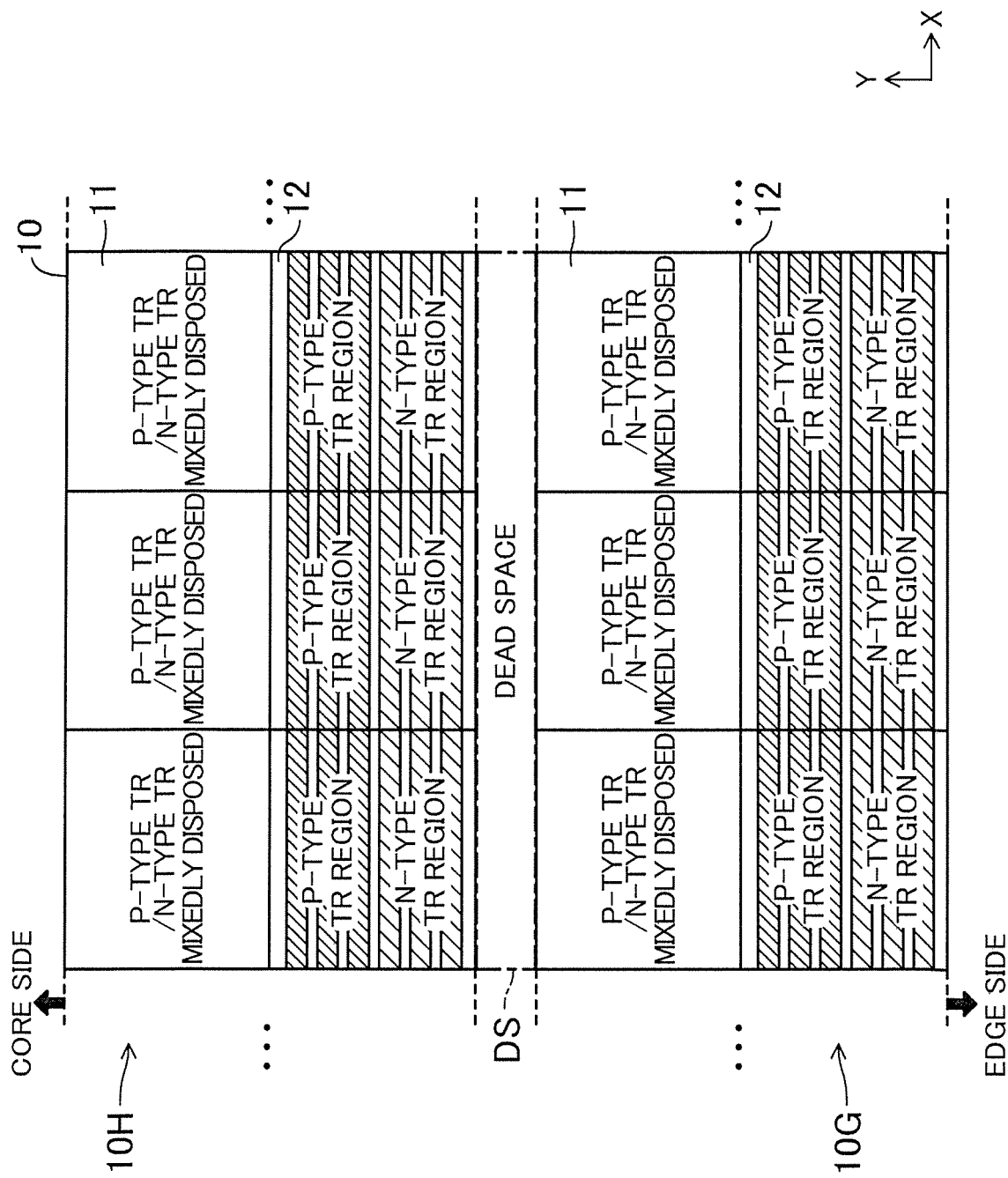
FIG. 4 shows a comparative example of the IO cell placement of FIG. 3.

FIG. 4 is a view showing IO cell placement according to a comparative example. In the configuration of FIG. 4, in both IO cell rows 10G and 10H, the low power supply voltage regions 11 are placed to be closer to the core region 2. In this placement, since the low power supply voltage regions 11 of the IO cell row 10G are opposed to the high power supply voltage regions 12 of the IO cell row 10H, it is necessary to secure space between the IO cell row 10G and the IO cell row 10H to avoid a latchup error. Dead space DS will therefore occur between the IO cell row 10G and the IO cell row 10H, resulting in an increase in the area of the semiconductor integrated circuit device.

In contrast to the above, in the placement example of FIG. 3, with no need to secure space for avoiding a latchup error, it is possible to avoid a latchup error without causing an increase in the area of the semiconductor integrated circuit device.

Figure 5:
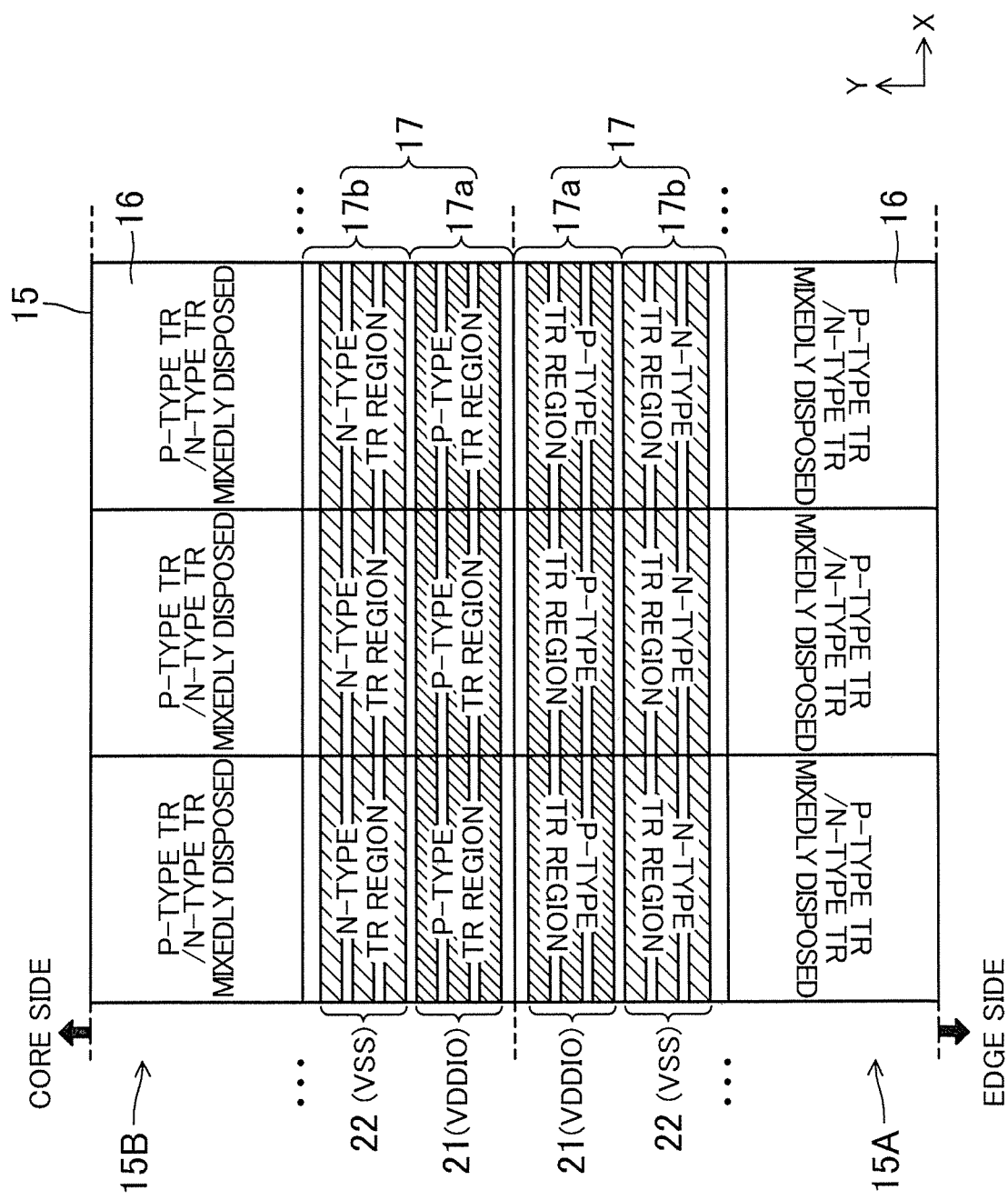
FIG. 5 shows an alteration of the IO cell placement of FIG. 3.

FIG. 5 shows an alteration of the placement example of FIG. 3. In the placement example of FIG. 5, in place of the IO cell 10, an IO cell 15 is placed in which the positions of the p-type transistor region and the n-type transistor region of the high power supply voltage region are exchanged. That is, in the IO cell 15, a low power supply voltage region 16 and a high power supply voltage region 17 are located separately in the Y direction, and in the high power supply voltage region 17, a p-type transistor region 17a and an n-type transistor region 17b are located separately in the Y direction.

As in the placement example of FIG. 3, the IO cells 15 of an IO cell row 15A are placed so that the high power supply voltage regions 17 are located closer to the core region 2, and the IO cells 15 of an IO cell row 15B are placed so that the low power supply voltage regions 16 are located closer to the core region 2. That is, the two IO cell rows 15A and 15B are placed so that the high power supply voltage regions 17 of these rows are mutually opposed. In this placement, as in the placement example of FIG. 3, it is unnecessary to secure space between the IO cell row 15A and the IO cell row 15B. Also, since the low power supply voltage regions 16 are located closer to the core region 2 in the IO cell row 15B, it is unnecessary to secure space between the IO cell row 15B and the core region 2.

In the configuration of the IO cell 10 shown in FIG. 2, there is a large potential difference between an n-well in the p-type transistor region 12a of the high power supply voltage region 12 and the low power supply voltage region 11 having p-type/n-type transistors disposed in a mixed manner. It is therefore necessary to secure large space between the p-type transistor region 12a and the low power supply voltage region 11. In contrast to this, in the configuration of the IO cell 15 shown in FIG. 5, since no large space is necessary between the n-type transistor region 17b and the low power supply voltage region 16, the area of the IO cell can be made smaller.

Note that, while the low power supply voltage region 11 was described having p-type/n-type transistors disposed in a mixed manner in the configuration of the IO cell 10 shown in FIG. 2, it may have a p-type transistor region and an n-type transistor region located separately in the Y direction. In this case, preferably, the n-type transistor region is located in the upper part of the low power supply voltage region 11 and the p-type transistor region in the lower part thereof as viewed from FIG. 2. That is, the transistor regions of the same conductivity type (the p-type transistor regions in this case) may be opposed to each other between the low power supply voltage region 11 and the high power supply voltage region 12, whereby the potential difference between the low power supply voltage region 11 and the high power supply voltage region 12 will be small. Likewise, for the same reason, in the configuration of the IO cell 15 shown in FIG. 5, in the case of dividing the low power supply voltage region 16 in the Y direction, the p-type transistor region is preferably located in the upper part and the n-type transistor region in the lower part.

Although two IO cell rows 10A and 10B are placed in this embodiment, the number of IO cell rows is not limited to two. For example, in the case of placing four IO cell rows, two pairs of the IO cell rows 10A and 10B described above may be placed side by side in the Y direction. In this case, also, advantages similar to those obtained in this embodiment can be obtained.

Although it was assumed that the IO cells 10 of the IO cell row 10A were the same in size and position in the Y direction and the IO cells 10 of the IO cell row 10B were the same in size and position in the Y direction in the placement example of FIG. 3, the configuration of this embodiment is not limited to this. Also, although it was assumed that, in the IO cell rows 10A and 10B, the opposed IO cells 10 were the same in size and position in the X direction, the configuration of this embodiment is not limited to this.

Second Embodiment

FIG. 6 is a view showing a placement example of IO cells 10 in a semiconductor integrated circuit device according to the second embodiment, which corresponds to an enlarged view of part X2 in FIG. 1. In FIG. 6, a first IO cell block 4 and a second IO cell block 5 are adjacent to each other in the X direction. The placement of the IO cells 10 in the first IO cell block 4 is similar to the configuration of FIG. 3. That is, two IO cell rows 10A and 10B, each including a plurality of IO cells 10 lined up in the X direction, are placed side by side in the Y direction. The IO cell row 10A, which corresponds to the first IO cell row, is placed closest to the edge of the chip 1 out of two or more IO cell rows (the IO cell rows 10A and 10B in the illustrated example) placed side by side in the Y direction. The IO cell row 10B, which corresponds to the second IO cell row, is placed adjacent to the IO cell row 10A on the core region 2 side of the IO cell row 10A.

The second IO cell block 5 has only one IO cell row 10C including a plurality of IO cells 10 lined up in the X direction, which corresponds to the third IO cell row. In the configuration shown in FIG. 6, the IO cell row 10A and the IO cell row 10C are placed in a line along the X direction.

In the placement example of FIG. 6, in the first IO cell block 4, the IO cells 10 of the IO cell row 10A are placed so that the high power supply source voltage regions 12 are located closer to the core region 2, and the IO cells 10 of the IO cell row 10B are placed so that the low power supply source voltage regions 11 are located closer to the core region 2. That is, the two IO cell rows 10A and 10B are placed so that the high power supply voltage regions 12 of these rows are mutually opposed. In the placement example of FIG. 6, it is assumed that the IO cells 10 of the IO cell row 10A are the same in size and position in the Y direction, and the IO cells 10 of the IO cell row 10B are the same in size and position in the Y direction. It is also assumed that, in the IO cell rows 10A and 10B, the opposed IO cells 10 are the same in size and position in the X direction. It is further assumed that the IO cells 10 of the IO cell rows 10A and 10C are the same in size and position in the Y direction.

In the first IO cell block 4, since the n-type transistor regions 12b of the high power supply voltage regions 12 of the IO cell rows 10A and 10B are mutually opposed, it is unnecessary to secure space for avoiding a latchup error between the IO cell row 10A and the IO cell row 10B. Also, since the low power supply voltage regions 11 are located closer to the core region 2 in the IO cell row 10B, it is unnecessary to secure space for avoiding a latchup error between the IO cell row 10B and the core region 2. These advantages are similar to those of the first embodiment.

In the second IO cell block 5, the IO cell row 10C is placed so that the high power supply voltage regions 12 are located closer to the edge of the chip 1. That is, the orientation of the IO cells 10 is inverted between the IO cell row 10A in the first IO cell block 4 and the IO cell row 10C in the second IO cell block 5. Since the high power supply voltage region is adjacent to the low lower supply voltage region or the core region between the first IO cell block 4 and the second IO cell block 5, dead space DS occur.

Figure 7A:
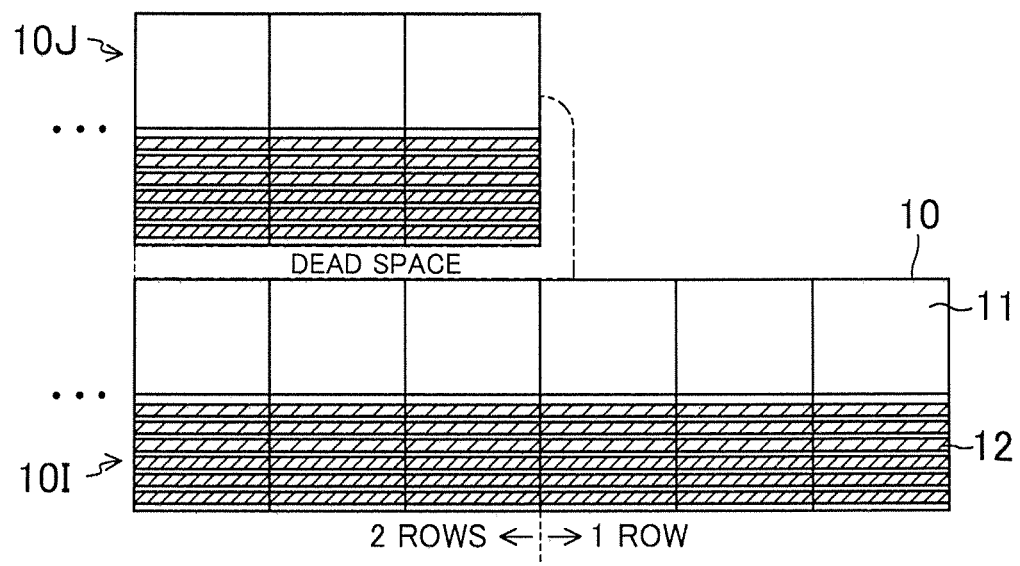
FIGS. 7A and 7B are comparative examples of the IO cell placement of FIG. 6.
Figure 7B:
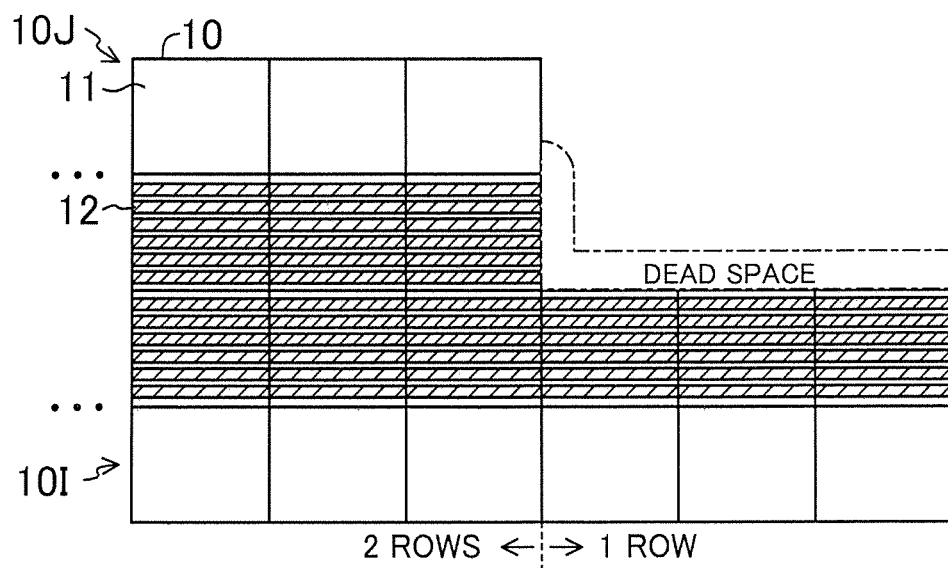

FIGS. 7A and 7B are views showing comparative examples of IO cell placement. In each of FIGS. 7A and 7B, IO cell rows 10I and 10J different in length are placed, forming IO cell placement including a portion of two IO cell rows and a portion of one IO cell row. In FIG. 7A, all of the IO cells have the same orientation. It is therefore necessary to provide space between the IO cell row 10I and the IO cell row 10J in the portion of two IO cell rows for a similar reason to that in FIG. 4, and thus dead space occurs. Dead space also occurs partly on the right side of the IO cell row 10J because the high power supply voltage region and the core region are adjacent to each other. In FIG. 7B, the orientation of the IO cells is inverted in the entire IO cell row 10I. Therefore, since the high power supply voltage regions 12 are mutually opposed in the portion of two IO cell rows, no dead space occurs between the IO cell row 10I and the IO cell row 10J. In the portion of one IO cell row, however, where the high power supply voltage regions 12 are located closer to the core region, since the high power supply voltage regions are adjacent to the core region over the entire portion of one IO cell row, dead space occurs on the core region side.

In contrast to the above, in the configuration of FIG. 6, no dead space occurs between the IO cell rows 10A and 10B in the first IO cell block 4. Also, in the second IO cell block 5, where the low power supply voltage regions 11 of the IO cell row 10C are located closer to the core region, no dead space occurs on the core region side. In other words, in the first IO cell block 4, i.e., in the portion of two IO cell rows, occurrence of dead space over the entire portion like in FIG. 7A is prevented. Also, in the second IO cell block 5, i.e., in the portion of one IO cell row, occurrence of dead space over the entire portion like in FIG. 7B is prevented. Accordingly, although the dead space DS occurs between the first IO cell block 4 and the second IO cell block 5, the entire amount of dead space can be widely reduced when the entire of the first and second IO cell blocks 4 and 5 is considered. It is therefore possible to avoid a latchup error while keeping the area of the semiconductor integrated circuit device small.

Figure 8:
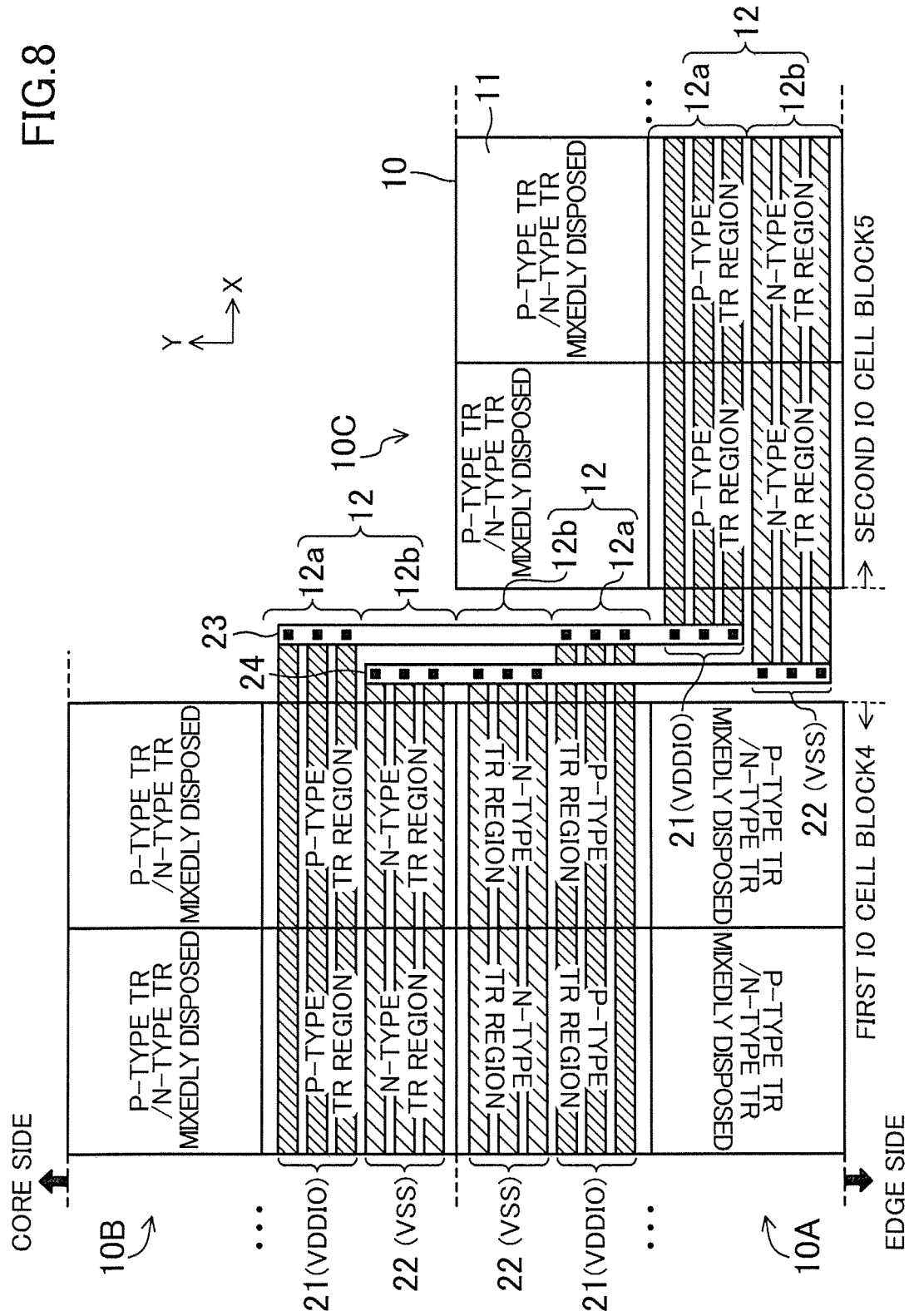
FIG. 8 shows an example in which power supply interconnects are provided in dead space in the IO cell placement of FIG. 6.

FIG. 8 shows an example in which power supply interconnects are provided in the dead space in the configuration of FIG. 6. In the configuration of FIG. 8, power supply interconnects 23 and 24 extending in the Y direction are placed between the first IO cell block 4 and the second IO cell block 5. The power supply interconnect 23 is an interconnect connecting the power supply interconnects 21 placed in the first IO cell block 4 and the power supply interconnects 21 placed in the second IO cell block 5, and is formed in an interconnect layer located above the power supply interconnects 21. The power supply interconnect 24 is an interconnect connecting the power supply interconnects 22 placed in the first IO cell block 4 and the power supply interconnects 22 placed in the second IO cell block 5, and is formed in an interconnect layer located above the power supply interconnects 22. With the configuration of FIG. 8, power supply can be strengthened utilizing the dead space between the first IO cell block 4 and the second IO cell block 5 effectively.

Although it was assumed that the IO cells 10 of the IO cell row 10A were the same in size and position in the Y direction and the IO cells 10 of the IO cell row 10B were the same in size and position in the Y direction in the configuration of FIG. 6, the configuration of this embodiment is not limited to this. Also, although it was assumed that, in the 10 cell rows 10A and 10B, the opposed IO cells 10 were the same in size and position in the X direction, the configuration of this embodiment is not limited to this. Further, although it was assumed that the IO cells 10 of the IO cell rows 10A and 10C were the same in size and position in the Y direction, the configuration of this embodiment is not limited to this. Moreover, although it was assumed that the IO cell row 10A and the IO cell row 10C were placed in a line along the X direction, the configuration of this embodiment is not limited to this.

Other Configuration Examples

Figure 9:
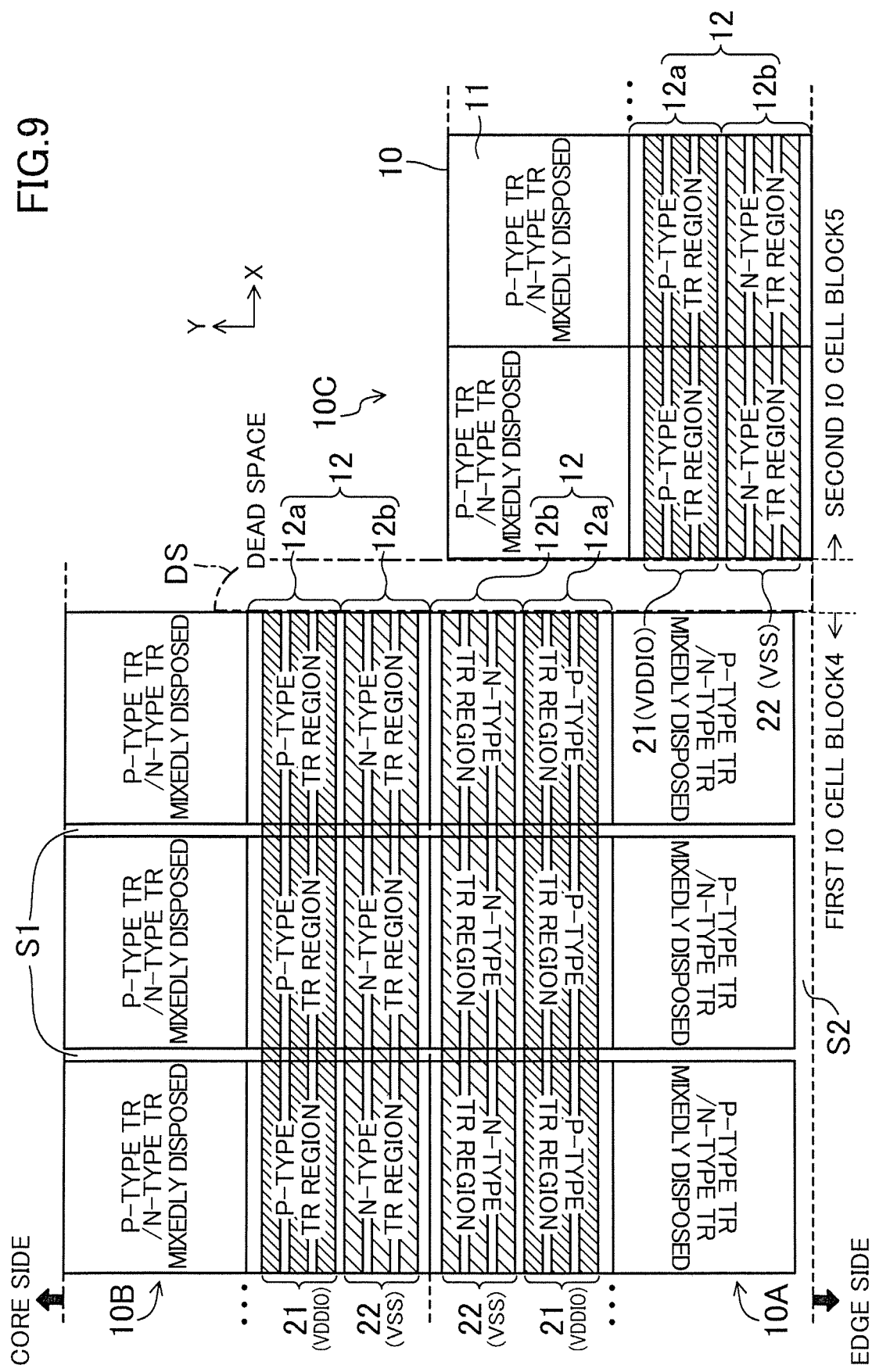
FIG. 9 shows an alteration of the IO cell placement of FIG. 6.

FIG. 9 shows another example of IO cell placement. The placement example of FIG. 9 is the same as the placement example of FIG. 6 except that space allowing running of a signal interconnect is provided in the first IO cell block 4. That is, space S1 allowing running of a signal interconnect is provided between the adjacent pairs of opposed IO cells 10 of the IO cell rows 10A and 10B. Also, space S2 allowing running of a signal interconnect is provided on the side of the IO cell row 10A closer to the edge of the chip I. The IO cell 10 normally has an input/output portion at an end of the low power supply voltage region 11. Therefore, formation of the space S1 and S2 makes it easy to connect the input/output portions of the IO cells 10 of the IO cell row 10A with internal core circuits provided in the core region 2.

Note that in the first embodiment, like in the placement example of FIG. 9, space allowing running of a signal interconnect may be provided.

Figure 10:
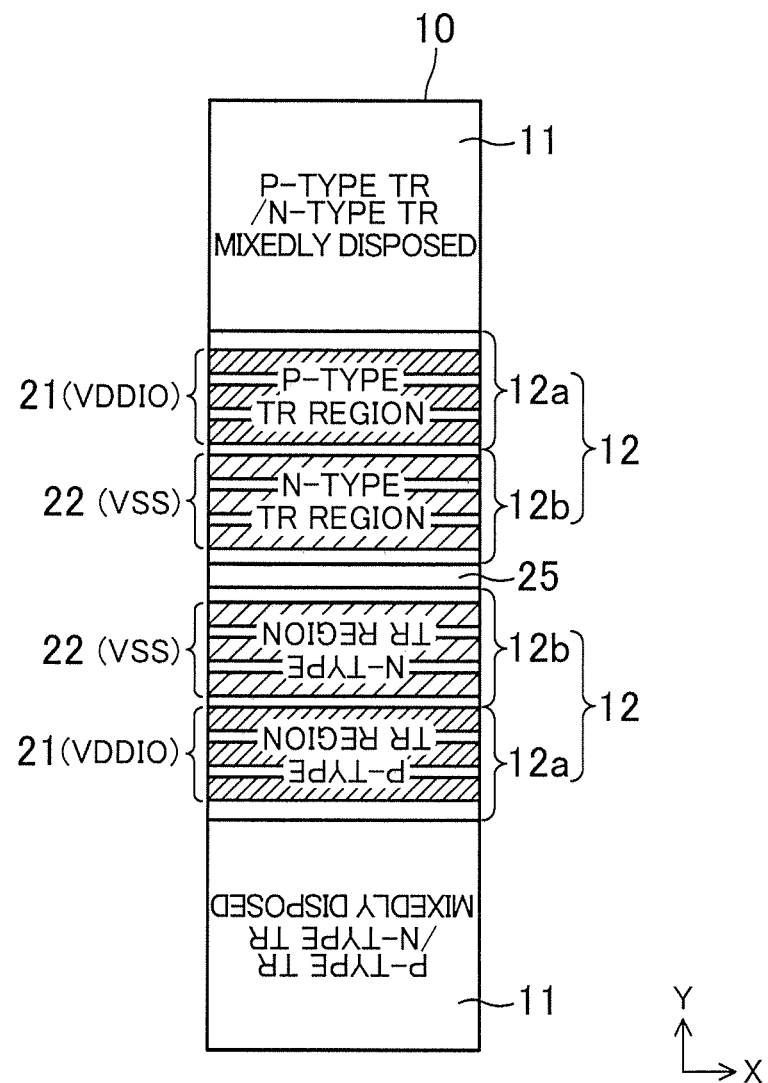
FIG. 10 shows another example of IO cell placement.

FIG. 10 is another configuration example of IO cell placement. In FIG. 10, the configuration of one pair of opposed IO cells 10 is shown for the convenience of illustration. Actually, such pairs of IO cells 10 shown in FIG. 10 are lined up in the X direction to constitute two IO cell rows. In FIG. 10, a power supply interconnect 25 extending in the X direction is placed between the opposed IO cells 10. Having the power supply interconnect 25, the power supply is further strengthened. The power supply interconnect 25 is herein assumed to strengthen the supply of the power supply potential VSS, for example. It may otherwise be assumed to strengthen the supply of the power supply potential VDDIO. A configuration like one in FIG. 10 may be employed in the first or second embodiment described above.

Figure 11:
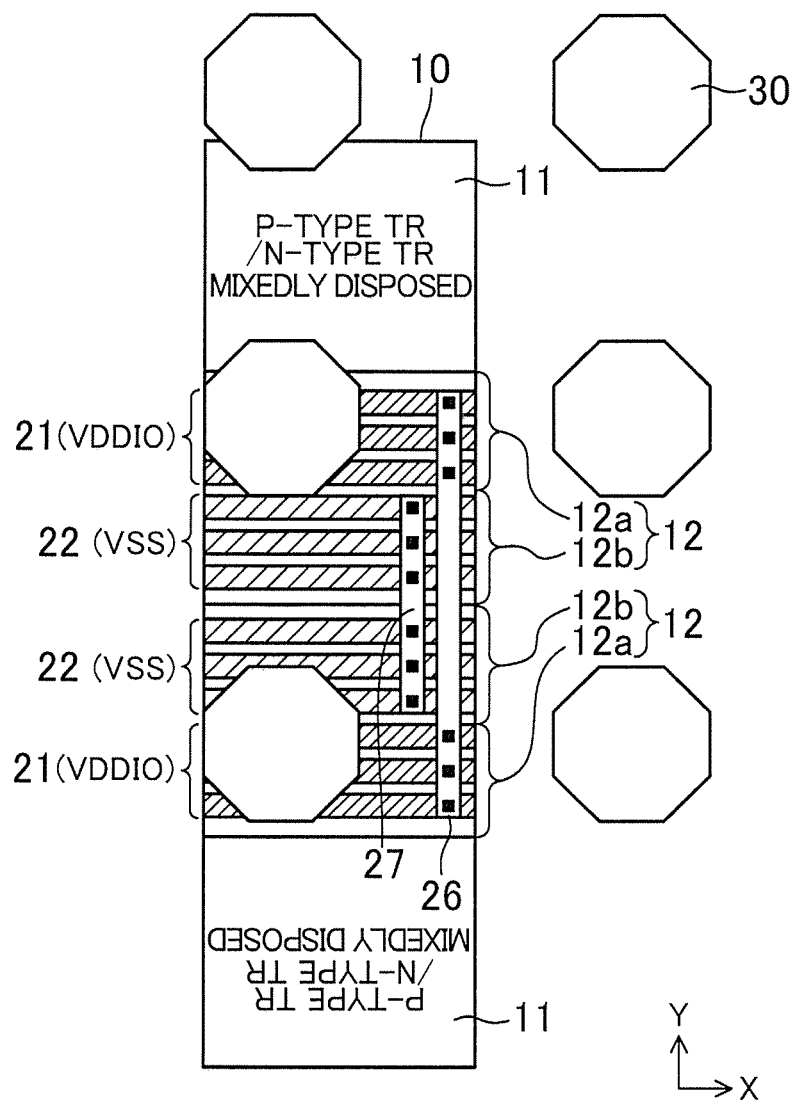
FIG. 11 shows yet another example of IO cell placement.

FIG. 11 is yet another configuration example of IO cell placement. In FIG. 11, the configuration of one pair of opposed 10 cells 10 is shown for the convenience of illustration. Actually, such pairs of IO cells 10 shown in FIG. 11 are lined up in the X direction to constitute two IO cell rows. In FIG. 11, pads 30 provided for connection with the outside of the chip 1 are shown. Note that illustration of interconnects connecting the IO cells 10 with the pads 30 is omitted. In FIG. 11, also, upper-layer power supply interconnects 26 and 27 extend in the Y direction in the same interconnect layer as the pads 30. The upper-layer power supply interconnect 26 mutually connects the power supply interconnects 21 of the opposed IO cells 10, and the upper-layer power supply interconnect 27 mutually connects the power supply interconnects 22 of the opposed IO cells 10. The power supply is further strengthened with these upper-layer power supply interconnects 26 and 27. A configuration like one in FIG. 11 may be employed in the first or second embodiment described above.

According to the present disclosure, a latchup error can be avoided without causing an increase in the area of the semiconductor integrated circuit device. The disclosure is therefore useful for size reduction and performance upgrading of LSIs.

What is claimed is:

1. A semiconductor integrated circuit device comprising:
    a chip;
    a core region provided on the chip; and
    an IO region provided between the core region and a periphery of the chip on the chip,
    wherein
        in the IO region, two or more IO cell rows, each having a plurality of IO cells lined up in a first direction that is a direction along the periphery of the chip, are placed side by side in a second direction perpendicular to the first direction,
        the two or more IO cell rows include
            a first IO cell row placed closest to an edge of the chip out of the two or more IO cell rows, and
            a second IO cell row placed to be adjacent to the first IO cell row on the side of the first IO cell row closer to the core region,
        each of the IO cells of the first and second IO cell rows has a high power supply voltage region and a low power supply voltage region provided separately in the second direction, and
            the first and second IO cell rows are placed so that the high power supply voltage regions of these rows are mutually opposed.

2. The semiconductor integrated circuit device of claim 1, wherein
    the high power supply voltage region has a p-type transistor region and an n-type transistor region provided separately in the second direction, and
    the first IO cell row and the second IO cell row are placed so that the p-type transistor regions of these rows are mutually opposed.

3. The semiconductor integrated circuit device of claim 1, wherein
    the IO cells of the first IO cell row are the same in size and position in the second direction, and
    the IO cells of the second IO cell row are the same in size and position in the second direction.

4. The semiconductor integrated circuit device of claim 1, wherein
    in the first IO cell row and the second IO cell row, opposed IO cells are the same in size and position in the first direction.

5. The semiconductor integrated circuit device of claim 1, wherein
    in the first and second IO cell rows, space allowing running of a signal interconnect is provided between adjacent pairs of opposed IO cells.

6. The semiconductor integrated circuit device of claim 1, wherein
    in the first and second IO cell rows, a power supply interconnect extending in the first direction is provided between opposed IO cells.

7. The semiconductor integrated circuit device of claim 1, wherein
    in the IO cells of the first and second IO cell rows, first power supply interconnects extending in the first direction are placed in the high power supply voltage regions, and
    in the first and second IO cell rows, an upper-layer power supply interconnect that is formed to extend in the second direction and connects the first power supply interconnects mutually is placed in an interconnect layer located above the first power supply interconnects.

8. The semiconductor integrated circuit device of claim 7, comprising
a pad provided for connection with the outside of the chip, wherein
the upper-layer power supply interconnect is formed in the same interconnect layer as the pad.

9. A semiconductor integrated circuit device comprising:
a chip;
a core region provided on the chip; and
an IO region provided between the core region and a periphery of the chip on the chip, including first and second IO cell blocks adjacent in a first direction that is a direction along the periphery of the chip,
wherein
in the first IO cell block, two or more IO cell rows, each having a plurality of IO cells lined up in the first direction, are placed side by side in a second direction perpendicular to the first direction,
the two or more IO cell rows include
a first IO cell row placed closest to an edge of the chip out of the two or more IO cell rows, and
a second IO cell row placed to be adjacent to the first IO cell row on the side of the first IO cell row closer to the core region,
in the second IO cell block, a third IO cell row having a plurality of IO cells lined up in the first direction is placed as a single row,
each of the IO cells of the first, second, and third IO cell rows has a high power supply voltage region and a low power supply voltage region provided separately in the second direction,
the first and second IO cell rows are placed so that the high power supply voltage regions of these rows are mutually opposed, and
the third IO cell row is placed so that the high power supply voltage regions are located closer to the edge of the chip.

10. The semiconductor integrated circuit device of claim 9, wherein
the first IO cell row and the third IO cell row are placed in a line along the first direction.

11. The semiconductor integrated circuit device of claim 9, wherein
the IO cells of the first and third IO cell rows are the same in size and position in the second direction.

12. The semiconductor integrated circuit device of claim 9, wherein
a power supply interconnect extending in the second direction is placed between the first IO cell block and the second IO cell block.

13. The semiconductor integrated circuit device of claim 9, wherein
the high power supply voltage region has a p-type transistor region and an n-type transistor region provided separately in the second direction, and
the first IO cell row and the second IO cell row are placed so that the p-type transistor regions of these rows are mutually opposed.

14. The semiconductor integrated circuit device of claim 9, wherein
the IO cells of the first IO cell row are the same in size and position in the second direction, and
the IO cells of the second IO cell row are the same in size and position in the second direction.

15. The semiconductor integrated circuit device of claim 9, wherein
in the first IO cell row and the second IO cell row, opposed IO cells are the same in size and position in the first direction.

16. The semiconductor integrated circuit device of claim 9, wherein
in the first and second IO cell rows, space allowing running of a signal interconnect is provided between adjacent pairs of opposed IO cells.

17. The semiconductor integrated circuit device of claim 9, wherein
in the first and second IO cell rows, a power supply interconnect extending in the first direction is provided between opposed IO cells.

18. The semiconductor integrated circuit device of claim 9, wherein
in the IO cells of the first and second IO cell rows, first power supply interconnects extending in the first direction are placed in the high power supply voltage regions, and
in the first and second IO cell rows, an upper-layer power supply interconnect that is formed to extend in the second direction and connects the first power supply interconnects mutually is placed in an interconnect layer located above the first power supply interconnects.

19. The semiconductor integrated circuit device of claim 18, comprising
a pad provided for connection with the outside of the chip, wherein
the upper-layer power supply interconnect is formed in the same interconnect layer as the pad.

* * * * *